(12) United States Patent
Ogawa et al.

(10) Patent No.: US 12,170,206 B2
(45) Date of Patent: Dec. 17, 2024

(54) METHOD OF PROCESSING SUBSTRATE, METHOD OF MANUFACTURING SEMICONDUCTOR DEVICE, RECORDING MEDIUM, AND SUBSTRATE PROCESSING APPARATUS

(71) Applicant: KOKUSAI ELECTRIC CORPORATION, Tokyo (JP)

(72) Inventors: Arito Ogawa, Toyama (JP); Norikazu Mizuno, Toyama (JP); Atsuhiko Ashitani, Toyama (JP); Atsuro Seino, Toyama (JP); Kota Kowa, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 17/698,593

(22) Filed: Mar. 18, 2022

(65) Prior Publication Data

US 2022/0208557 A1    Jun. 30, 2022

Related U.S. Application Data

(63) Continuation of application No. PCT/JP2019/036675, filed on Sep. 19, 2019.

(51) Int. Cl.
*H01L 21/3213* (2006.01)
*C23F 1/12* (2006.01)
*H01L 21/285* (2006.01)
*H01L 21/306* (2006.01)

(52) U.S. Cl.
CPC .......... *H01L 21/32135* (2013.01); *C23F 1/12* (2013.01); *H01L 21/28562* (2013.01); *H01L 21/28568* (2013.01); *H01L 21/30604* (2013.01); *H01L 21/30621* (2013.01)

(58) Field of Classification Search
None
See application file for complete search history.

(56) References Cited

U.S. PATENT DOCUMENTS

| | | | |
|---|---|---|---|
| 10,872,814 B2 * | 12/2020 | Narushima | ....... H01L 21/28562 |
| 2003/0091739 A1 | 5/2003 | Sakamoto et al. | |
| 2017/0053810 A1 | 2/2017 | Yang et al. | |
| 2018/0033689 A1 * | 2/2018 | Anthis | ............. H01L 21/76879 |
| 2018/0076051 A1 * | 3/2018 | Shinoda | ............ H01L 21/32136 |

FOREIGN PATENT DOCUMENTS

| | | |
|---|---|---|
| JP | 07-201835 A | 8/1995 |
| JP | 2003-247071 A | 9/2003 |
| JP | 2008-270509 A | 11/2008 |
| JP | 2009-043973 A | 2/2009 |

(Continued)

OTHER PUBLICATIONS

Japanese Office Action issued on Feb. 7, 2023 for Japanese Patent Application No. 2021-546127.

(Continued)

*Primary Examiner* — Jiong-Ping Lu
(74) *Attorney, Agent, or Firm* — Volpe Koenig

(57) ABSTRACT

A film having film continuity can be formed.

There is provided a technique including: preparing a substrate having a metal-containing film formed on a surface thereof; and slimming the metal-containing film by pulse-supplying a halogen-containing gas to the substrate.

9 Claims, 8 Drawing Sheets

(56) References Cited

FOREIGN PATENT DOCUMENTS

| | | | | |
|---|---|---|---|---|
| JP | 2009-43973 | A | 2/2009 | |
| JP | 2011-66263 | A | 3/2011 | |
| JP | 2011-119433 | A | 6/2011 | |
| JP | 2016-58478 | A | 4/2016 | |
| JP | 2017-063186 | A | 3/2017 | |
| JP | 2017-63186 | A | 3/2017 | |
| JP | 2018-041886 | A | 3/2018 | |
| JP | 2018-41886 | A | 3/2018 | |
| TW | 201826378 | A | 7/2018 | |
| WO | WO2017099718 | * | 6/2017 | ......... H01L 21/3065 |

OTHER PUBLICATIONS

Japanese Office Action issued on Jun. 20, 2023 for Japanese Patent Application No. 2021-546127.
Taiwan Office Action issued on Jan. 17, 2022 for Taiwan Patent Application No. 109128710.

* cited by examiner

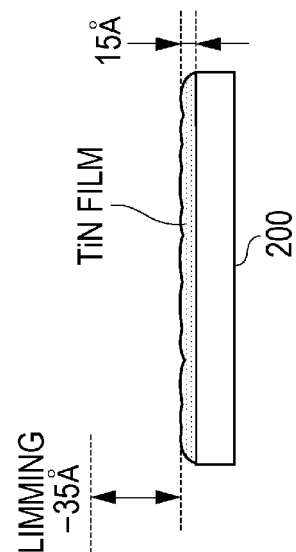
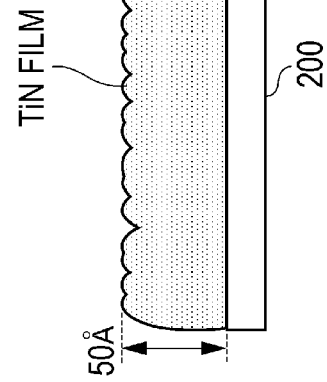
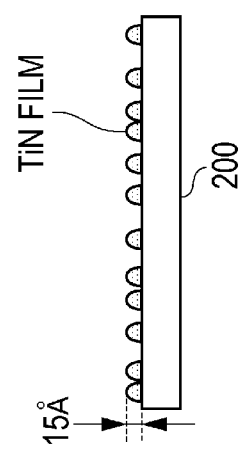

METHOD OF PROCESSING SUBSTRATE, METHOD OF MANUFACTURING SEMICONDUCTOR DEVICE, RECORDING MEDIUM, AND SUBSTRATE PROCESSING APPARATUS

CROSS-REFERENCE TO RELATED APPLICATION

This application is a Bypass Continuation application of PCT International Application No. PCT/JP2019/036675, filed on Sep. 19, 2019, in the WIPO, the entire contents of which are hereby incorporated by reference.

TECHNICAL FIELD

The present disclosure relates to a method of processing a substrate, a method of manufacturing a semiconductor device, a recording medium, and a substrate processing apparatus.

BACKGROUND

For example, a tungsten (W) film is used for a control gate of a NAND type flash memory having a three-dimensional structure, and a tungsten hexafluoride ($WF_6$) gas containing W may be used for forming the W film. For example, a titanium nitride (TiN) film may be formed as a barrier film between the W film and an insulating film. The TiN film plays a role of enhancing adhesion between the W film and the insulating film and also plays a role of preventing fluorine (F) contained in the W film from diffusing into the insulating film. The TiN film is desirably a thin film from a viewpoint of wiring resistance.

However, when an attempt is made to form a thin film having a thickness of 30 Å or less on the insulating film, for example, the TiN film may be formed in an island shape, and adhesion with the W film may become poor. In addition, F contained in the W film may be diffused into the insulating film via a portion where the TiN film is not formed.

SUMMARY

The present disclosure provides a technique capable of forming a film having film continuity.

An aspect of the present disclosure provides a technique including: preparing a substrate having a metal-containing film formed on a surface thereof; and slimming the metal-containing film by pulse-supplying a halogen-containing gas to the substrate.

BRIEF DESCRIPTION OF THE DRAWINGS

FIG. 5A is a schematic view illustrating a case where a TiN film having a thickness of 15 Å is formed on a substrate by a film forming step in the above-described film forming sequence, and FIGS. 5B and 5C are schematic views illustrating a case where a TiN film having a thickness of 15 Å is formed on a substrate by the film forming step and a slimming step in the above-described film forming sequence.

DETAILED DESCRIPTION

Figure 1:
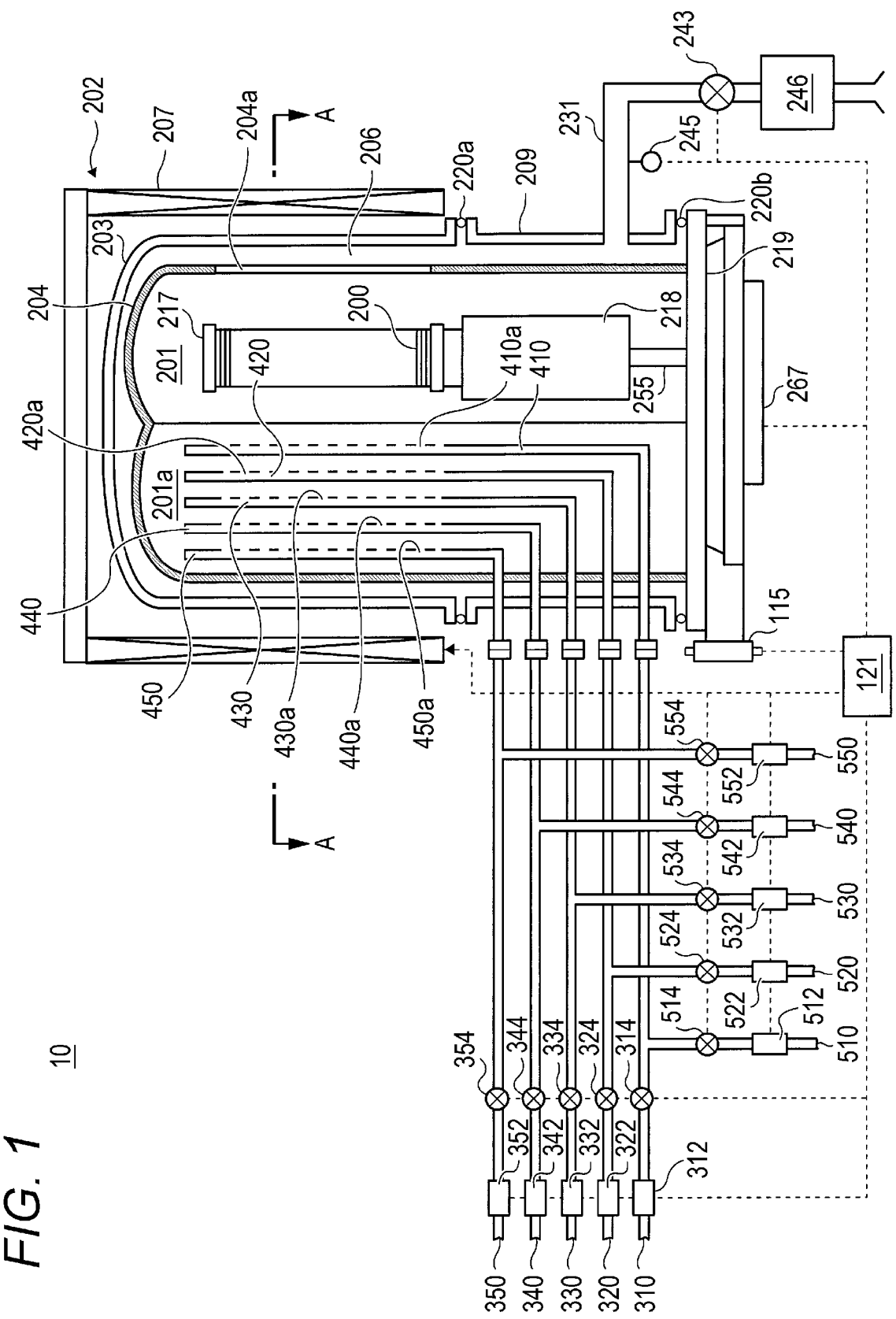
FIG. 1 is a vertical cross-sectional view schematically illustrating a vertical process furnace of a substrate processing apparatus according to an embodiment of the present disclosure.

Hereinafter, description will be made with reference to FIGS. 1 to 4.

(1) CONFIGURATION OF SUBSTRATE PROCESSING APPARATUS

A substrate processing apparatus 10 includes a process furnace 202 including a heater 207 as a heating means (heating mechanism or heating system). The heater 207 has a cylindrical shape, and is vertically installed by being supported by a heater base (not illustrated) as a holding plate.

Inside the heater 207, an outer tube 203 constituting a reaction vessel (process vessel) concentrically with the heater 207 is disposed.

The outer tube 203 is made of a heat resistant material such as quartz ($SiO_2$) or silicon carbide (SiC), for example, and is formed in a cylindrical shape with an upper end closed and a lower end opened. Below the outer tube 203, a manifold (inlet flange) 209 is disposed concentrically with the outer tube 203. The manifold 209 is made of, for example, a metal such as stainless steel (SUS) and is formed in a cylindrical shape with an upper end and a lower end opened. Between the upper end of the manifold 209 and the outer tube 203, an O-ring 220a as a seal member is disposed. When the manifold 209 is supported by the heater base, the outer tube 203 is vertically installed.

Inside the outer tube 203, an inner tube 204 constituting the reaction vessel is disposed. The inner tube 204 is made of a heat resistant material such as quartz ($SiO_2$) or silicon carbide (SiC), for example, and is formed in a cylindrical shape with an upper end closed and a lower end opened. The outer tube 203, the inner tube 204, and the manifold 209 mainly constitute the process vessel (reaction vessel). In a cylindrical hollow portion of the process vessel (inside the inner tube 204), a process chamber 201 is formed.

The process chamber 201 can house wafers 200 as substrates in a state where the wafers 200 are arranged in multiple stages in the vertical direction in a horizontal posture by a boat 217 described later.

In the process chamber 201, nozzles 410, 420, 430, 440, and 450 are disposed so as to penetrate a side wall of the manifold 209 and the inner tube 204. To the nozzles 410, 420, 430, 440, and 450, gas supply pipes 310, 320, 330, 340, and 350 are connected, respectively. However, the process furnace 202 of the present embodiment is not limited to the above-described form.

The gas supply pipes 310, 320, 330, 340, and 350 include mass flow controllers (MFCs) 312, 322, 332, 342, and 352 which are flow rate controllers, respectively. The gas supply pipes 310, 320, 330, 340, and 350 include valves 314, 324, 334, 344, and 354 which are on-off valves, respectively. To downstream sides of the valves 314, 324, 334, 344, and 354 of the gas supply pipes 310, 320, 330, 340, and 350, gas supply pipes 510, 520, 530, 540, and 550 that supply an inert gas are connected, respectively. The gas supply pipes 510, 520, 530, 540, and 550 include MFCs 512, 522, 532, 542, and 552 which are flow rate controllers and valves 514, 524, 534, 544, and 554 which are on-off valves, respectively, in order from an upstream side.

To distal ends of the gas supply pipes 310, 320, 330, 340, and 350, nozzles 410, 420, 430, 440, and 450 are connected, respectively. The nozzles 410, 420, 430, 440, and 450 are configured as L-shaped nozzles, and horizontal portions thereof are disposed so as to penetrate a side wall of the manifold 209 and the inner tube 204. Vertical portions of the nozzles 410, 420, 430, 440, and 450 are disposed inside a spare chamber 201a having a channel shape (groove shape) formed so as to protrude outward in a radial direction of the inner tube 204 and to extend in the vertical direction, and are disposed upward (upward in an arrangement direction of the wafers 200) along an inner wall of the inner tube 204 in the spare chamber 201a.

The nozzles 410, 420, 430, 440, and 450 are disposed so as to extend from a lower area of the process chamber 201 to an upper area of the process chamber 201, and include a plurality of gas supply holes 410a, a plurality of gas supply holes 420a, a plurality of gas supply holes 430a, a plurality of gas supply holes 440a, and a plurality of gas supply holes 450a at positions facing the wafers 200, respectively. As a result, a process gas is supplied from the gas supply holes 410a, 420a, 430a, 440a, and 450a of the nozzles 410, 420, 430, 440, and 450 to the wafers 200, respectively. The plurality of gas supply holes 410a, the plurality of gas supply holes 420a, the plurality of gas supply holes 430a, the plurality of gas supply holes 440a, and the plurality of gas supply holes 450a are formed from a lower portion to an upper portion of the inner tube 204, have the same opening area, and are formed at the same opening pitch. However, the gas supply holes 410a, 420a, 430a, 440a, and 450a are not limited to the above-described form. For example, the opening area may be gradually increased from a lower portion to an upper portion of the inner tube 204. As a result, a flow rate of gas supplied from the gas supply holes 410a, 420a, 430a, 440a, and 450a can be made more uniform.

The plurality of gas supply holes 410a, the plurality of gas supply holes 420a, the plurality of gas supply holes 430a, the plurality of gas supply holes 440a, and the plurality of gas supply holes 450a of the nozzles 410, 420, 430, 440, and 450 are formed at height positions from a lower portion to an upper portion of the boat 217 described later. Therefore, the process gas supplied from the gas supply holes 410a, 420a, 430a, 440a, and 450a of the nozzles 410, 420, 430, 440, and 450 into the process chamber 201 is supplied to the entire region of the wafers 200 housed from the lower portion to the upper portion of the boat 217. The nozzles 410, 420, 430, 440, and 450 only need to be disposed so as to extend from a lower area to an upper area of the process chamber 201, but are preferably disposed so as to extend to the vicinity of a ceiling of the boat 217.

From the gas supply pipe 310, a raw material gas containing a metal element (metal-containing gas) is supplied as a process gas into the process chamber 201 via the MFC 312, the valve 314, and the nozzle 410. As the raw material, for example, titanium tetrachloride ($TiCl_4$) as a halogen-based raw material (halide or halogen-based titanium raw material) containing titanium (Ti) as a metal element is used.

From the gas supply pipe 320, a reducing gas is supplied as a process gas into the process chamber 201 via the MFC 322, the valve 324, and the nozzle 420. As the reducing gas, for example, a silane-based gas (for example, $SiH_4$) as a reducing gas containing silicon (Si) and hydrogen (H) and not containing halogen can be used. $SiH_4$ acts as a reducing agent.

From the gas supply pipe 330, a reactant gas is supplied as a process gas into the process chamber 201 via the MFC 332, the valve 334, and the nozzle 430. As the reactant gas, for example, an ammonia ($NH_3$) gas as a N-containing gas containing nitrogen (N) can be used.

From the gas supply pipe 340, an oxygen-containing gas is supplied as a process gas into the process chamber 201 via the MFC 342, the valve 344, and the nozzle 440. As the oxygen-containing gas, for example, an oxygen ($O_2$) gas, an ozone ($O_3$) gas, or water vapor ($H_2O$) can be used.

From the gas supply pipe 350, a halogen-containing gas containing a metal element is supplied as a process gas into the process chamber 201 via the MFC 352, the valve 354, and the nozzle 450. The metal element is, for example, tungsten fluoride (WF). As the halogen-containing gas, for example, a tungsten hexafluoride ($WF_6$) gas, a nitrogen trifluoride ($NF_3$) gas, a chlorine trifluoride ($ClF_3$) gas, a fluorine ($F_2$) gas, or a hydrogen fluoride (HF) gas can be used.

From the gas supply pipes 510, 520, 530, 540, and 550, for example, a nitrogen ($N_2$) gas is supplied as an inert gas into the process chamber 201 via the MFCs 512, 522, 532, 542, and 552, the valves 514, 524, 534, 544, and 554, and the nozzles 410, 420, 430, 440, and 450, respectively. Hereinafter, an example of using a $N_2$ gas as the inert gas will be described, but as the inert gas, for example, a rare gas such as an argon (Ar) gas, a helium (He) gas, a neon (Ne) gas, or a xenon (Xe) gas may be used in addition to the $N_2$ gas.

The gas supply pipes 310, 320, 330, 340, and 350, the MFCs 312, 322, 332, 342, and 352, the valves 314, 324, 334, 344, and 354, and the nozzles 410, 420, 430, 440, and 450 mainly constitute a process gas supply system, but only the nozzles 410, 420, 430, 440, and 450 may be considered as the process gas supply system. The process gas supply system may be simply referred to as a gas supply system. When the raw material gas is caused to flow from the gas supply pipe 310, the gas supply pipe 310, the MFC 312, and the valve 314 mainly constitute a raw material gas supply system, but the nozzle 410 may be included in the raw material gas supply system. When the reducing gas is caused to flow from the gas supply pipe 320, the gas supply pipe 320, the MFC 322, and the valve 324 mainly constitute a reducing gas supply system, but the nozzle 420 may be included in the reducing gas supply system. When the reactant gas is caused to flow from the gas supply pipe 330, the gas supply pipe 330, the MFC 332, and the valve 334 mainly constitute a reactant gas supply system, but the nozzle 430 may be included in the reactant gas supply system. When the nitrogen-containing gas is supplied as the reactant gas from the gas supply pipe 330, the reactant gas supply system can also be referred to as a nitrogen-containing gas supply system. When the oxygen-containing gas is caused to flow from the gas supply pipe 340, the gas supply pipe 340, the MFC 342, and the valve 344 mainly constitute an oxygen-containing gas supply system, but the nozzle 440 may be included in the oxygen-containing gas supply system. When the halogen-containing gas is caused to flow from the gas supply pipe 350, the gas supply pipe 350, the MFC 352, and the valve 354 mainly constitute a halogen-containing gas supply system, but the nozzle 450 may be included in the halogen-containing gas supply system. The gas supply pipes 510, 520, 530, 540, and 550, the MFCs 512, 522, 532, 542, and 552, and the valves 514, 524, 534, 544, and 554 mainly constitute an inert gas supply system.

In a gas supply method in the present embodiment, gas is transferred via the nozzles 410, 420, 430, 440, and 450 disposed in the spare chamber 201a in an annular and vertically long space defined by an inner wall of the inner tube 204 and ends of the plurality of wafers 200. Then, from the plurality of gas supply holes 410a, the plurality of gas supply holes 420a, the plurality of gas supply holes 430a, the plurality of gas supply holes 440a, and the plurality of gas supply holes 450a of the nozzles 410, 420, 430, 440, and 450 formed at positions facing the wafers, gas is ejected into the inner tube 204.

More specifically, the raw material gas or the like is ejected in a direction parallel to surfaces of the wafers 200 by the gas supply holes 410a of the nozzle 410, the gas supply holes 420a of the nozzle 420, the gas supply holes 430a of the nozzle 430, the gas supply holes 440a of the nozzle 440, and the gas supply holes 450a of the nozzle 450.

An exhaust hole (exhaust port) 204a is a through-hole formed in a side wall of the inner tube 204 at a position facing the nozzles 410, 420, 430, 440, and 450, and is, for example, a slit-shaped through-hole opened so as to be elongated in the vertical direction. The gas that has been supplied from the gas supply holes 410a, 420a, 430a, 440a, and 450a of the nozzles 410, 420, 430, 440, and 450 into the process chamber 201 and has flowed on surfaces of the wafers 200 flows into an exhaust path 206 formed by a gap between the inner tube 204 and the outer tube 203 via the exhaust hole 204a. Then, the gas that has flowed into the exhaust path 206 flows into an exhaust pipe 231 and is discharged to the outside of the process furnace 202.

The exhaust hole 204a is formed at a position facing the plurality of wafers 200, and the gas supplied from the gas supply holes 410a, 420a, 430a, 440a, and 450a to the vicinity of the wafers 200 in the process chamber 201 flows in the horizontal direction and then flows into the exhaust path 206 via the exhaust hole 204a. The exhaust hole 204a is not limited to being configured as a slit-shaped through-hole, and may be formed by a plurality of holes.

The manifold 209 includes the exhaust pipe 231 that exhausts the atmosphere in the process chamber 201. To the exhaust pipe 231, a pressure sensor 245 as a pressure detector that detects a pressure in the process chamber 201, an auto pressure controller (APC) valve 243, and a vacuum pump 246 as a vacuum exhaust device are connected in order from an upstream side. The APC valve 243 can perform vacuum exhaust and vacuum exhaust stop in the process chamber 201 by opening and closing the valve in a state where the vacuum pump 246 is operated, and furthermore, can adjust a pressure in the process chamber 201 by adjusting the degree of valve opening in a state where the vacuum pump 246 is operated. The exhaust hole 204a, the exhaust path 206, the exhaust pipe 231, the APC valve 243, and the pressure sensor 245 mainly constitute an exhaust system. The vacuum pump 246 may be included in the exhaust system.

Below the manifold 209, a seal cap 219 as a furnace lid capable of airtightly closing a lower end opening of the manifold 209 is disposed. The seal cap 219 is configured to abut against a lower end of the manifold 209 from a lower side in the vertical direction. The seal cap 219 is made of, for example, a metal such as SUS and is formed in a disk shape. On an upper surface of the seal cap 219, an O-ring 220b as a seal member abutting against the lower end of the manifold 209 is disposed. On a side of the seal cap 219 opposite to the process chamber 201, a rotation mechanism 267 that rotates the boat 217 that houses the wafers 200 is disposed. A rotation shaft 255 of the rotation mechanism 267 penetrates the seal cap 219 and is connected to the boat 217. The rotation mechanism 267 is configured to rotate the wafers 200 by rotating the boat 217. The seal cap 219 is configured to be lifted and lowered in the vertical direction by a boat elevator 115 as a lifting/lowering mechanism vertically disposed outside the outer tube 203. The boat elevator 115 is configured to be able to load the boat 217 into the process chamber 201 and unload the boat 217 out of the process chamber 201 by lifting and lowering the seal cap 219. The boat elevator 115 is configured as a transfer device (transfer mechanism) that transfers the boat 217 and the wafers 200 housed in the boat 217 to the inside and the outside of the process chamber 201.

The boat 217 as a substrate support tool is configured such that a plurality of, for example, 25 to 200 wafers 200 are arranged at intervals in the vertical direction in a horizontal posture and in a state where the centers thereof are aligned with each other. The boat 217 is made of a heat resistant material such as quartz or SiC, for example. In a lower portion of the boat 217, a heat insulating plate 218 made of a heat resistant material such as quartz or SiC, for example, is supported in multiple stages (not illustrated) in a horizontal posture. With this configuration, heat from the heater 207 is less likely to be transferred to the seal cap 219 side. However, the present embodiment is not limited to the above-described form. For example, a heat insulating tube configured as a cylindrical member made of a heat resistant material such as quartz or SiC may be disposed without disposing the heat insulating plate 218 at the lower portion of the boat 217.

Figure 2:
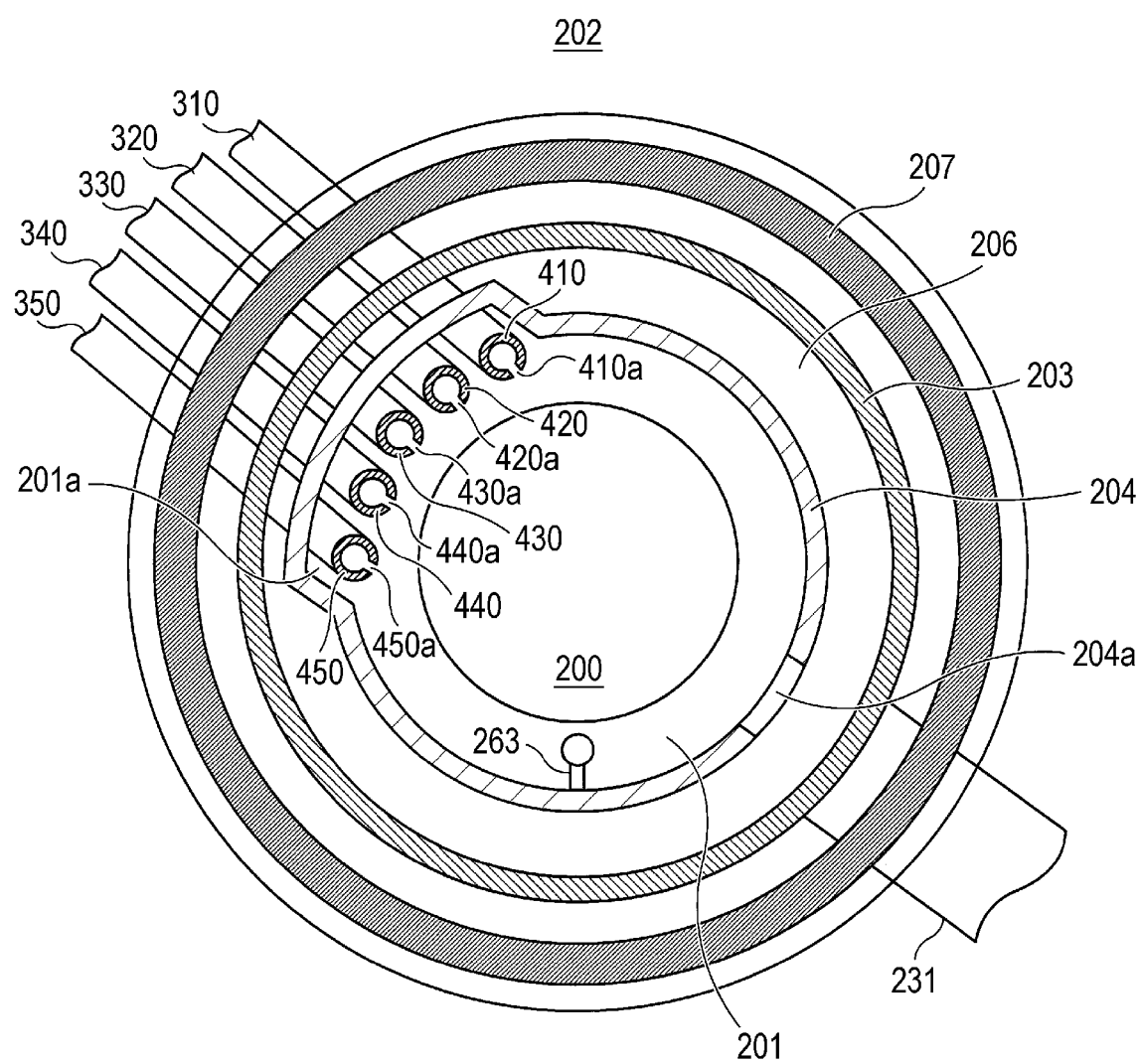
FIG. 2 is a schematic horizontal cross-sectional view taken along line A-A in FIG. 1.

As illustrated in FIG. 2, a temperature sensor 263 as a temperature detector is disposed in the inner tube 204, and it is configured such that the temperature in the process chamber 201 has a desired temperature distribution by adjusting an energization amount to the heater 207 based on temperature information detected by the temperature sensor 263. The temperature sensor 263 is formed in an L shape similarly to the nozzles 410, 420, 430, 440, and 450, and is disposed along an inner wall of the inner tube 204.

Figure 3:
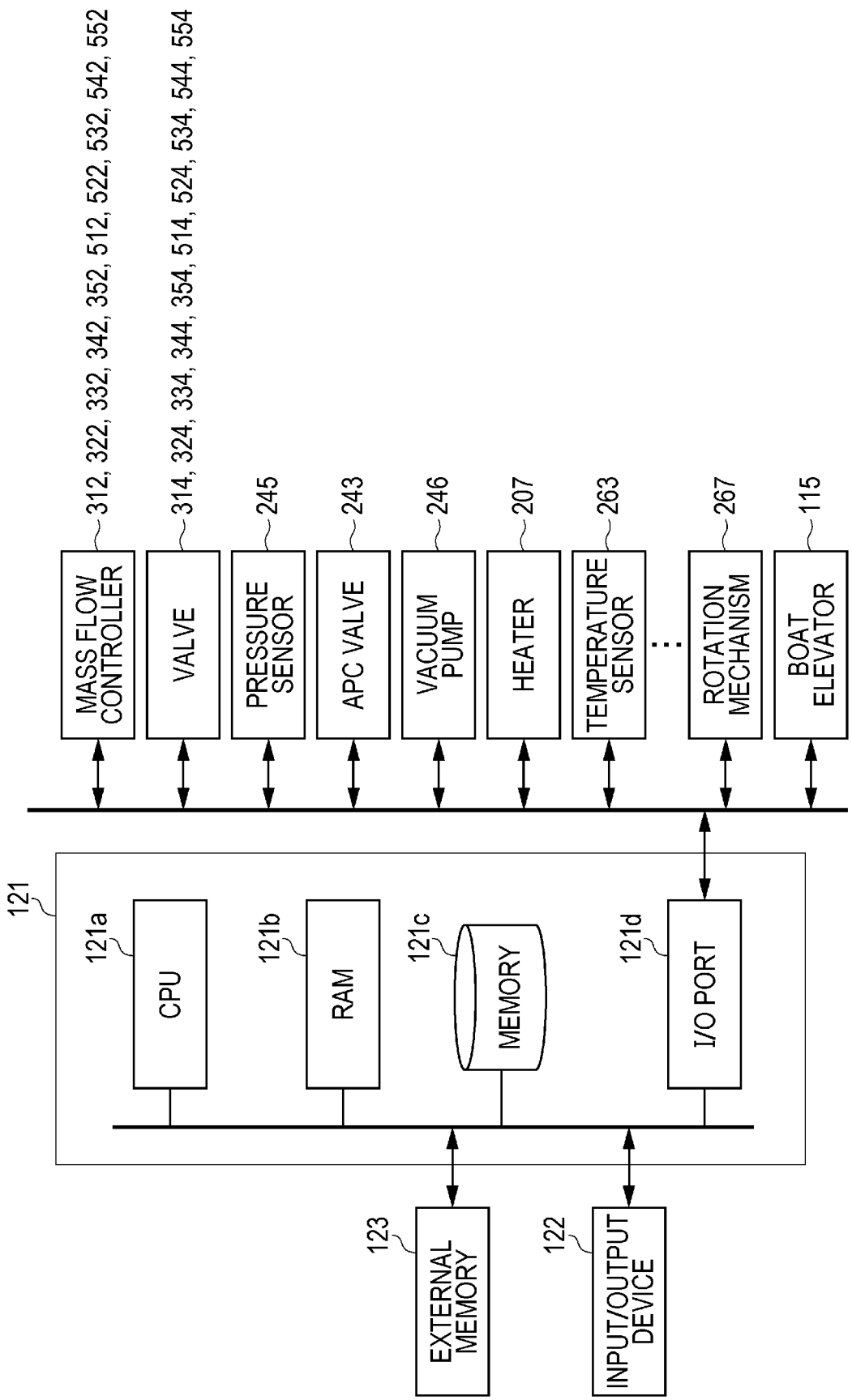
FIG. 3 is a schematic configuration diagram of a controller of the substrate processing apparatus according to the embodiment of the present disclosure, and is a block diagram illustrating a control system of the controller.

As illustrated in FIG. 3, the controller 121 is configured as a computer including a central processing unit (CPU) 121a, a random access memory (RAM) 121b, a memory 121c, and an I/O port 121d. The RAM 121b, the memory 121c, and the I/O port 121d are configured to exchange data with the CPU 121a via an internal bus. To the controller 121, an input/output device 122 configured as, for example, a touch panel is connected.

The memory 121c is configured by, for example, a flash memory and a hard disk drive (HDD). In the memory 121c, a control program that controls an operation of the substrate processing apparatus, a process recipe in which a procedure, a condition, and the like of a method of manufacturing a semiconductor device described later are described, and the like are readably stored. The process recipe is a combination formed so as to cause the controller 121 to execute steps in a method of manufacturing a semiconductor device described later to obtain a predetermined result, and functions as a program. Hereinafter, the process recipe, the control program, and the like are also collectively and simply referred to as a program. In the present specification, the term "program" may include only the process recipe alone, only the control program alone, or a combination of the process recipe and the control program. The RAM 121*b* is configured as a memory area (work area) in which a program, data, and the like read by the CPU 121*a* are temporarily stored.

The I/O port 121*d* is connected to the MFCs 312, 322, 332, 342, 352, 512, 522, 532, 542, and 552, the valves 314, 324, 334, 344, 354, 514, 524, 534, 544, and 554, the pressure sensor 245, the APC valve 243, the vacuum pump 246, the heater 207, the temperature sensor 263, the rotation mechanism 267, the boat elevator 115, and the like.

The CPU 121*a* is configured to read the control program from the memory 121*c* to execute the control program, and to read a recipe and the like from the memory 121*c* in response to an input of an operation command from the input/output device 122 and the like. The CPU 121*a* is configured to control various gases flow rate adjustment operations of the MFCs 312, 322, 332, 342, 352, 512, 522, 532, 542, and 552, open and close operations of the valves 314, 324, 334, 344, 354, 514, 524, 534, 544, and 554, an open and close operation of the APC valve 243, a pressure adjustment operation of the APC valve 243 based on the pressure sensor 245, a temperature adjustment operation of the heater 207 based on the temperature sensor 263, start and stop of the vacuum pump 246, boat 217 rotation and a boat 217 rotation speed adjustment operation of the rotation mechanism 267, a boat 217 lifting and lowering operation of the boat elevator 115, an operation of housing the wafers 200 into the boat 217, and the like according to the contents of the read recipe.

The controller 121 can be configured by installing the above-described program stored in an external memory (for example, a magnetic tape, a magnetic disk such as a flexible disk or a hard disk, an optical disk such as a CD or a DVD, a magneto-optical disk such as an MO, or a semiconductor memory such as a USB memory or a memory card) 123 in a computer. The memory 121*c* and the external memory 123 are configured as computer-readable recording media.

Hereinafter, the memory 121*c* and the external memory 123 are collectively and simply referred to as a recording medium. In the present specification, the term "recording medium" may include only the memory 121*c* alone, only the external memory 123 alone, or both of these. A program may be provided to a computer using a communication means such as the Internet or a dedicated line without using the external memory 123.

(2) SUBSTRATE PROCESSING STEP

As one step of a semiconductor device (device) manufacturing process, for example, an example of a step of forming a metal film constituting a gate electrode on the wafer 200 will be described with reference to FIG. 4. The step of forming the metal film is performed using the process furnace 202 of the substrate processing apparatus 10 described above. In the following description, operations of the units constituting the substrate processing apparatus 10 are controlled by the controller 121.

A substrate processing process (semiconductor device manufacturing process) according to the present embodiment includes a step of preparing the wafer 200 having a TiN film which is a metal-containing film formed on a surface thereof, and a slimming step of slimming the TiN film by pulse-supplying a $WF_6$ gas which is a halogen-containing gas to the wafer 200 having the TiN film formed thereon. Here, the slimming means that the metal-containing film is etched to be thinned.

In the slimming step, before the $WF_6$ gas is pulse-supplied, an $O_2$ gas which is an oxygen-containing gas is supplied, and the $O_2$ gas and the $WF_6$ gas are alternately supplied.

Here, the pulse supply means that gas is intermittently supplied.

In the present specification, the term "wafer" may mean a "wafer itself" or a "laminate of a wafer and a predetermined layer, film, or the like formed on a surface of the wafer". In the present specification, the term "surface of a wafer" may mean a "surface of a wafer itself" or a "surface of a predetermined layer, film, or the like formed on the wafer". In the present specification, the term "substrate" is synonymous with the word "wafer".

(Wafer Loading)

When the boat 217 is charged with the plurality of wafers 200 (wafer charge), as illustrated in FIG. 1, the boat 217 supporting the plurality of wafers 200 is lifted and loaded into the process chamber 201 (boat load) by the boat elevator 115. In this state, the seal cap 219 is in a state of airtightly closing a lower end opening of the reaction tube 203 via the O-ring 220.

(Pressure Adjustment and Temperature Adjustment)

The inside of the process chamber 201 is vacuum-exhausted by the vacuum pump 246 so as to have a desired pressure (degree of vacuum). At this time, the pressure in the process chamber 201 is measured by the pressure sensor 245, and the APC valve 243 is feedback-controlled based on the measured pressure information. The vacuum pump 246 maintains a state of being constantly operated at least until the processing on the wafers 200 is completed. The inside of the process chamber 201 is heated by the heater 207 so as to have a predetermined temperature. At this time, an energization amount to the heater 207 is feedback-controlled based on temperature information detected by the temperature sensor 263 such that the inside of the process chamber 201 has a predetermined temperature distribution. The inside of the process chamber 201 is continuously heated by the heater 207 at least until processing on the wafers 200 is completed.

[Film Forming Step]

($TiCl_4$ Gas Supply, First Step)

The valve 314 is opened to cause a $TiCl_4$ gas which is a raw material gas to flow into the gas supply pipe 310. The flow rate of the $TiCl_4$ gas is adjusted by the MFC 312, and the $TiCl_4$ gas is supplied from the gas supply holes 410*a* of the nozzle 410 into the process chamber 201, and is exhausted from the exhaust pipe 231. At this time, the $TiCl_4$ gas is supplied to the wafers 200. At this time, the valve 514 is simultaneously opened to cause an inert gas such as a $N_2$ gas to flow into the gas supply pipe 510. The flow rate of the $N_2$ gas flowing in the gas supply pipe 510 is adjusted by the MFC 512, and the $N_2$ gas that has flowed in the gas supply pipe 510 is supplied together with the $TiCl_4$ gas into the process chamber 201, and is exhausted from the exhaust pipe 231. At this time, in order to prevent the $TiCl_4$ gas from entering the nozzles 420, 430, 440, and 450, the valves 524, 534, 544, and 554 are opened, and a $N_2$ gas is caused to flow into the gas supply pipes 520, 530, 540, and 550. The $N_2$ gas is supplied into the process chamber 201 via the gas supply pipes 320, 330, 340, and 350 and the nozzles 420, 430, 440, and 450, and is exhausted from the exhaust pipe 231.

At this time, the APC valve 243 is adjusted to set a pressure in the process chamber 201 to, for example, a pressure within a range of 1 to 3990 Pa. The supply flow rate of the TiCl$_4$ gas controlled by the MFC 312 is, for example, a flow rate within a range of 0.1 to 2.0 slm.

The supply flow rate of the N$_2$ gas controlled by each of the MFCs 512, 522, 532, 542, and 552 is, for example, a flow rate within a range of 0.1 to 20 slm. At this time, the temperature of the heater 207 is set to a temperature at which the temperature of the wafers 200 is, for example, within a range of 300 to 500° C.

At this time, the gases flowing in the process chamber 201 are only the TiCl$_4$ gas and the N$_2$ gas. By supplying the TiCl$_4$ gas, a Ti-containing layer is formed on the wafer 200 (base film on a surface). The Ti-containing layer may be a Ti layer containing Cl or an adsorption layer of TiCl$_4$, or may include both of these.

(Residual Gas Removal, Second Step)

After a lapse of a predetermined time from start of supply of the TiCl$_4$ gas, for example, after 0.01 to 10 seconds, the valve 314 is closed to stop supply of the TiCl$_4$ gas. At this time, with the APC valve 243 of the exhaust pipe 231 open, the inside of the process chamber 201 is vacuum-exhausted by the vacuum pump 246, and the residual TiCl$_4$ gas that is unreacted or has contributed to formation of the Ti-containing layer in the process chamber 201 is removed from the inside of the process chamber 201. At this time, with the valves 514, 524, 534, 544, and 554 open, supply of the N$_2$ gas into the process chamber 201 is maintained. The N$_2$ gas acts as a purge gas, and can enhance an effect of removing the residual TiCl$_4$ gas that is unreacted or has contributed to formation of the Ti-containing layer in the process chamber 201 from the inside of the process chamber 201.

(NH$_3$ Gas Supply, Third Step)

After the residual gas in the process chamber 201 is removed, the valve 334 is opened to cause an NH$_3$ gas as a reactant gas to flow into the gas supply pipe 330. The flow rate of the NH$_3$ gas is adjusted by the MFC 332, and the NH$_3$ gas is supplied from the gas supply holes 430a of the nozzle 430 into the process chamber 201, and is exhausted from the exhaust pipe 231. At this time, the NH$_3$ gas is supplied to the wafers 200. At this time, the valve 534 is simultaneously opened to cause a N$_2$ gas to flow into the gas supply pipe 530. The flow rate of the N$_2$ gas flowing in the gas supply pipe 530 is adjusted by the MFC 532. The N$_2$ gas is supplied together with the NH$_3$ gas into the process chamber 201, and is exhausted from the exhaust pipe 231. At this time, in order to prevent the NH$_3$ gas from entering the nozzles 410, 420, 440, and 450, the valves 514, 524, 544, and 554 are opened, and a N$_2$ gas is caused to flow into the gas supply pipes 510, 520, 540, and 550. The N$_2$ gas is supplied into the process chamber 201 via the gas supply pipes 310, 320, 340, and 350 and the nozzles 410, 420, 440, and 450, and is exhausted from the exhaust pipe 231.

At this time, the APC valve 243 is adjusted to set a pressure in the process chamber 201 to, for example, a pressure within a range of 1 to 3990 Pa. The supply flow rate of the NH$_3$ gas controlled by the MFC 332 is, for example, a flow rate within a range of 0.1 to 30 slm. The supply flow rate of the N$_2$ gas controlled by each of the MFCs 512, 522, 532, 542, and 552 is, for example, a flow rate within a range of 0.1 to 30 slm. Time during which the NH$_3$ gas is supplied to the wafers 200 is, for example, a time within a range of 0.01 to 30 seconds. The temperature of the heater 207 at this time is set to a similar temperature to that in the TiCl$_4$ gas supply step.

At this time, the gases flowing in the process chamber 201 are only the NH$_3$ gas and the N$_2$ gas. The NH$_3$ undergoes a substitution reaction with at least a part of the Ti-containing layer formed on the wafer 200 in the first step. During the substitution reaction, Ti contained in the Ti-containing layer and N contained in the NH$_3$ gas are bonded to each other to form a TiN layer on the wafer 200.

(Residual Gas Removal, Fourth Step)

After the TiN layer is formed, the valve 334 is closed to stop supply of the NH$_3$ gas. Then, the residual NH$_3$ gas that is unreacted or has contributed to formation of the TiN layer in the process chamber 201 and a reaction by-product are removed from the inside of the process chamber 201 by a similar processing procedure to the residual gas removal described above.

(Predetermined Number of Times of Execution)

By performing the cycle of sequentially performing the first to fourth steps described above a predetermined number of times (n times), a TiN film having a predetermined thickness (for example, a film thickness thicker than 40 Å) and film continuity is formed on the wafer 200.

[Slimming Step]

(O$_2$ Gas Supply, Fifth Step)

The valve 344 is opened to cause an O$_2$ gas which is an oxygen-containing gas to flow into the gas supply pipe 340. The flow rate of the O$_2$ gas is adjusted by the MFC 342, and the O$_2$ gas is supplied from the gas supply holes 440a of the nozzle 440 into the process chamber 201, and is exhausted from the exhaust pipe 231. At this time, the O$_2$ gas is supplied to the wafers 200. At this time, the valve 544 is simultaneously opened to cause an inert gas such as a N$_2$ gas to flow into the gas supply pipe 540. The flow rate of the N$_2$ gas flowing in the gas supply pipe 540 is adjusted by the MFC 542, and the N$_2$ gas that has flowed in the gas supply pipe 540 is supplied together with the O$_2$ gas into the process chamber 201, and is exhausted from the exhaust pipe 231. At this time, the valves 514, 524, 534, and 554 are closed to stop supply of the N$_2$ gas from the nozzles 410, 420, 430, and 450.

At this time, the APC valve 243 is adjusted to set a pressure in the process chamber 201 to, for example, a pressure within a range of 0.1 to 3990 Pa. The supply flow rate of the O$_2$ gas controlled by the MFC 342 is, for example, a flow rate within a range of 0.1 to 10 slm. The supply flow rate of the N$_2$ gas controlled by the MFC 542 is, for example, a flow rate within a range of 0.1 to 20 slm. At this time, the temperature of the heater 207 is set such that the temperature of the wafers 200 is kept constant, for example, within a range of 300 to 500° C. which is the same as the film formation temperature during the film forming step. Note that the temperature in this step may be set so as to be different from the film formation temperature.

At this time, the gas flowing in the process chamber 201 is the O$_2$ gas. Supply of the O$_2$ gas oxidizes the TiN film on the wafer 200 (base film on a surface) to form a titanium oxynitride (TiNO) film on a surface of the TiN film.

(Residual gas removal, sixth step) After a lapse of a predetermined time from start of supply of the O$_2$ gas, the valve 344 is closed to stop supply of the O$_2$ gas. At this time, with the APC valve 243 of the exhaust pipe 231 open, the inside of the process chamber 201 is vacuum-exhausted by the vacuum pump 246, and the residual O$_2$ gas that is unreacted or has contributed to formation of the TiNO layer in the process chamber 201 is removed from the inside of the process chamber 201 At this time, with the valve 544 open, the valves 514, 524, 534, and 554 are opened to start supply of a $N_2$ gas into the process chamber 201. The $N_2$ gas acts as a purge gas, and can enhance an effect of removing the residual $O_2$ gas that is unreacted or has contributed to formation of the TiNO layer in the process chamber 201 from the inside of the process chamber 201.

($WF_6$ Gas Supply, Seventh Step)

After the residual gas in the process chamber 201 is removed, the valve 354 is opened to cause a $WF_6$ gas as a halogen-containing gas to flow into the gas supply pipe 350. The flow rate of the $WF_6$ gas is adjusted by the MFC 352, and the $WF_6$ gas is supplied from the gas supply holes 450a of the nozzle 450 into the process chamber 201, and is exhausted from the exhaust pipe 231. At this time, the $WF_6$ gas is supplied to the wafers 200. At this time, the valve 554 is simultaneously opened to cause an inert gas such as a $N_2$ gas to flow into the gas supply pipe 550. The flow rate of the $N_2$ gas flowing in the gas supply pipe 550 is adjusted by the MFC 552, and the $N_2$ gas that has flowed in the gas supply pipe 550 is supplied together with the $WF_6$ gas into the process chamber 201, and is exhausted from the exhaust pipe 231. At this time, the valves 514, 524, 534, and 544 are closed to stop supply of the $N_2$ gas from the nozzles 410, 420, 430, and 440.

At this time, the APC valve 243 is adjusted to set a pressure in the process chamber 201 to, for example, a pressure within a range of 0.1 to 6650 Pa. The supply flow rate of the $WF_6$ gas controlled by the MFC 352 is, for example, a flow rate within a range of 0.01 to 10 slm. The supply flow rate of the $N_2$ gas controlled by the MFC 552 is, for example, a flow rate within a range of 0.1 to 30 slm. Time during which the $WF_6$ gas is supplied to the wafers 200 is, for example, a time within a range of 0.01 to 30 seconds.

At this time, the gas flowing in the process chamber 201 is the $WF_6$ gas. Supply of the $WF_6$ gas etches the TiNO layer formed on the wafer 200 in the fifth step.

(Residual Gas Removal, Eighth Step)

After a lapse of a predetermined time from start of supply of the $WF_6$ gas, the valve 354 is closed to stop supply of the $WF_6$ gas.

Then, the residual $WF_6$ gas that is unreacted or has contributed to formation of the TiN layer, TiWFxOy which is a reaction by-product, and the like in the process chamber 201 are discharged from the inside of the process chamber 201 by a similar processing procedure to the residual gas removal described above.

(Predetermined Number of Times of Execution)

By performing the cycle of sequentially performing the fifth to eighth steps described above one or more times (a predetermined number of times (m times)), the TiNO layer on the wafer 200 is etched to form a TiN film having a predetermined thickness (for example, 5 to less than 40 Å). The above-described cycle is preferably repeated a plurality of times.

That is, by alternately pulse-supplying the $O_2$ gas and the $WF_6$ gas, it is possible to improve removal efficiency of TiWFxOy which is a by-product obtained by a reaction between the $WF_6$ gas and the TiN layer. In addition, by pulse supply, a slimming amount (etching amount) can be controlled.

[Predetermined Number of Times of Execution]

By performing the cycle of sequentially performing the film forming step (first to fourth steps) and the slimming step (fifth to eighth steps) described above one or more times (a predetermined number of times (1 times)), a TiN film having a predetermined thickness and film continuity is formed on the wafer 200. Note that the slimming step may be performed after the TiN film is collectively formed by performing the film forming step a plurality of times.

(After Purge and Return to Atmospheric Pressure)

A $N_2$ gas is supplied from each of the gas supply pipes 510 to 550 into the process chamber 201, and is exhausted from the exhaust pipe 231. The $N_2$ gas acts as a purge gas, whereby the inside of the process chamber 201 is purged with the inert gas, and a residual gas and a by-product in the process chamber 201 are removed from the inside of the process chamber 201 (after purge). Thereafter, the atmosphere in the process chamber 201 is replaced with an inert gas (inert gas replacement), and the pressure in the process chamber 201 is returned to a normal pressure (return to atmospheric pressure).

(Wafer Unloading)

Thereafter, the seal cap 219 is lowered by the boat elevator 115, and a lower end of the reaction tube 203 is opened. Then, the processed wafers 200 are unloaded (boat unloading) from the lower end of the reaction tube 203 to the outside of the reaction tube 203 in a state of being supported by the boat 217. Thereafter, the processed wafers 200 are taken out from the boat 217 (wafer discharge).

(3) EXAMPLE

Figure 4:
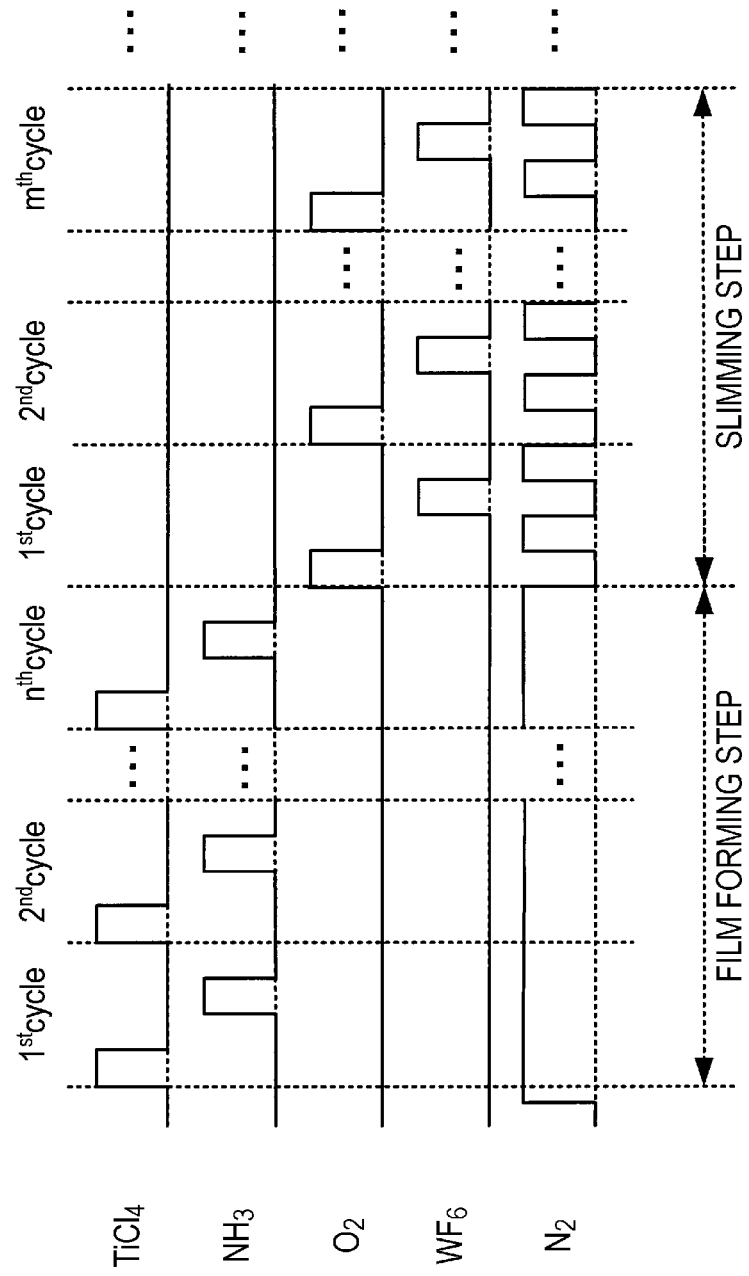
FIG. 4 is a diagram illustrating a film forming sequence according to the embodiment of the present disclosure.

FIG. 5A is a schematic view illustrating a case where a TiN film having a thickness of 15 Å is formed on a wafer 200 by the above-described film forming step of FIG. 4 using the above-described substrate processing apparatus 10, and FIGS. 5B and 5C are schematic views illustrating a case where a TiN film having a thickness of 15 Å is formed on the wafer 200 by the above-described film forming step and slimming step of FIG. 4 using the above-described substrate processing apparatus 10.

As illustrated in FIG. 5A, when an attempt is made to form a TiN film having a thickness of 15 Å on the wafer 200 only by the film forming step, the TiN film is discontinuously formed in an island shape on the wafer 200. In this case, a surface coverage ratio of the TiN film is 27.8%. On the other hand, as illustrated in FIG. 5B, by forming a TiN film having a thickness of 50 Å on the wafer 200 by the film forming step (surface coverage ratio 100%), and then, as illustrated in FIG. 5C, performing a slimming step to form a TiN film having a thickness of 15 Å, the TiN film is continuously formed. Then, the surface coverage ratio in this case is maintained at 100%.

That is, when a thin film having a thickness of about 15 Å is formed on the wafer 200, by forming a TiN film having a thick film thickness of about 50 Å on the wafer 200 and then etching the TiN film, a TiN film having film continuity and a thin film thickness of about 15 Å can be formed.

That is, according to the present embodiment, a TiN film having a predetermined thickness (a thick film thickness with film continuity) is formed on the wafer 200, and then etched to a predetermined thickness (a thin film thickness with film continuity). This makes it possible to enhance adhesion between the W film and the insulating film while lowering resistivity of the TiN film, and to prevent fluorine (F) contained in the W film from diffusing into the insulating film.

(4) EFFECTS OF PRESENT EMBODIMENT

According to the present embodiment, one or more effects described below can be obtained.

(a) A TiN film having film continuity can be formed.

(b) Adhesion between the W film and the insulating film can be enhanced.

(c) Fluorine (F) contained in the W film can be prevented from diffusing into the insulating film.

(d) Resistivity can be reduced.

(5) MODIFICATION

Modification 1

Figure 6:
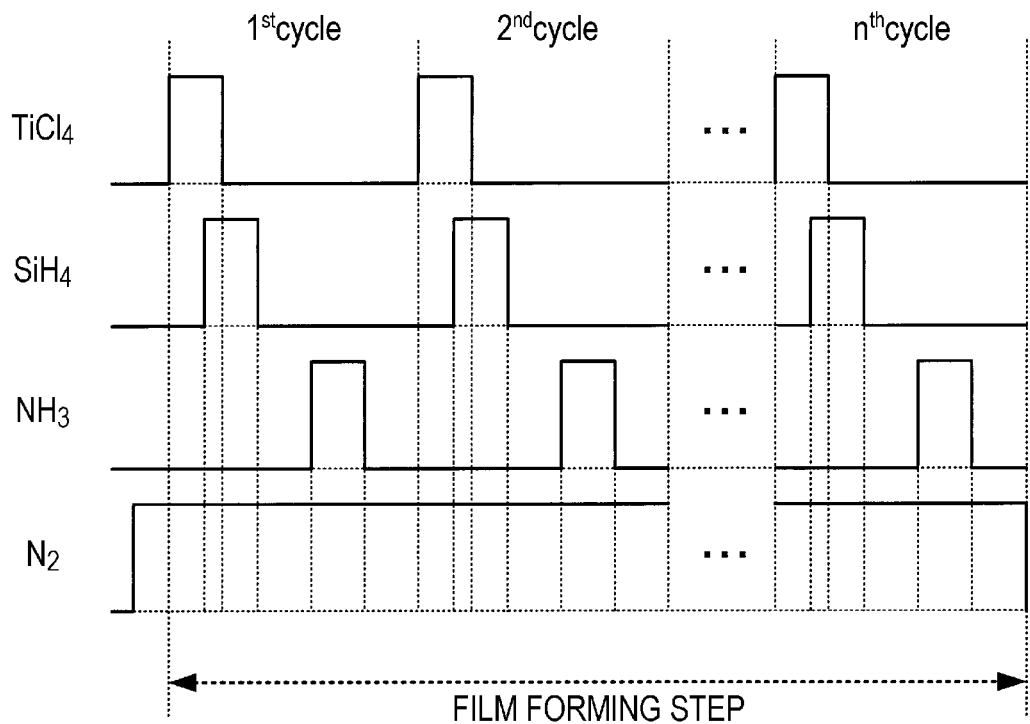
FIG. 6 is a diagram illustrating a modification of the film forming step in the film forming sequence according to the embodiment of the present disclosure.

Modification 1 is different from the above-described embodiment in the film forming step. Specifically, in the first step in the film forming step of the above-described embodiment, a $SiH_4$ gas is supplied during supply of the $TiCl_4$ gas. FIG. 6 is a diagram illustrating a timing of gas supply in the film forming step of Modification 1 applied to the present embodiment. In the following Modification, only differences from the above-described embodiment will be described in detail.

[Film Forming Step]
($TiCl_4$ Gas Supply, First Step)

A $TiCl_4$ gas is supplied into the process chamber 201 by a similar processing procedure to the $TiCl_4$ gas supply in the first step of the film forming step of the above-described embodiment. At this time, gases flowing in the process chamber 201 are only the $TiCl_4$ gas and a $N_2$ gas, and a Ti-containing layer is formed on the wafer 200 (base film on a surface) by supplying the $TiCl_4$ gas.

($SiH_4$ Gas Supply)

After a lapse of a predetermined time from start of supply of the $TiCl_4$ gas, for example, after 0.01 to 5 seconds, the valve 324 is opened to cause a $SiH_4$ gas which is a reducing gas to flow into the gas supply pipe 320. The flow rate of the $SiH_4$ gas is adjusted by the MFC 322, and the $SiH_4$ gas is supplied from the gas supply holes 420a of the nozzle 420 into the process chamber 201, and is exhausted from the exhaust pipe 231. At this time, the valve 524 is simultaneously opened to cause an inert gas such as a $N_2$ gas to flow into the gas supply pipe 520. The flow rate of the $N_2$ gas flowing in the gas supply pipe 520 is adjusted by the MFC 522, and the $N_2$ gas that has flowed in the gas supply pipe 520 is supplied together with the $SiH_4$ gas into the process chamber 201, and is exhausted from the exhaust pipe 231. At this time, in order to prevent the $TiCl_4$ gas and the $SiH_4$ gas from entering the nozzles 430, 440, and 450, the valves 534, 544, and 554 are opened, and a $N_2$ gas is caused to flow into the gas supply pipes 530, 540, and 550. At this time, the $TiCl_4$ gas, the $SiH_4$ gas, and the $N_2$ gas are simultaneously supplied to the wafers 200. That is, there is a timing when at least the $TiCl_4$ gas and the $SiH_4$ gas are simultaneously supplied.

At this time, the APC valve 243 is adjusted to set a pressure in the process chamber 201 to, for example, a pressure within a range of 130 to 3990 Pa. If the pressure in the process chamber 201 is lower than 130 Pa, there is a possibility that Si contained in the $SiH_4$ gas enters the Ti-containing layer, and the Si content contained in a TiN film to be formed increases to form a TiSiN film. Similarly, if the pressure in the process chamber 201 is higher than 3990 Pa, there is a possibility that Si contained in the $SiH_4$ gas enters the Ti-containing layer, and the Si content contained in a TiN film to be formed increases to form a TiSiN film. As described above, even if the pressure in the process chamber 201 is too low or too high, the elemental composition of a film to be formed changes. The supply flow rate of the $SiH_4$ gas controlled by the MFC 322 is, for example, a flow rate within a range of 0.1 to 5 slm. The supply flow rate of the $N_2$ gas controlled by each of the MFCs 512, 522, 532, 542, and 552 is, for example, a flow rate within a range of 0.01 to 20 slm. The temperature of the heater 207 at this time is set to a similar temperature to that in the $TiCl_4$ gas supply step.

After a lapse of a predetermined time from start of supply of the $TiCl_4$ gas, for example, after 0.01 to 10 seconds, the valve 314 of the gas supply pipe 310 is closed to stop supply of the $TiCl_4$ gas. At this time, in order to prevent the $SiH_4$ gas from entering the nozzle 410, with the valve 514 open, a $N_2$ gas is caused to flow into the gas supply pipes 510, 530, 540, and 550. The $N_2$ gas is supplied into the process chamber 201 via the gas supply pipes 310, 330, 340, and 350 and the nozzles 410, 430, 440, and 450, and is exhausted from the exhaust pipe 231. At this time, the $SiH_4$ gas and the $N_2$ gas are supplied to the wafers 200.

(Residual Gas Removal, Second Step)

SiH After a lapse of a predetermined time from start of supply of the $SiH_4$ gas, for example, after 0.01 to 60 seconds, the valve 324 is closed to stop supply of the $SiH_4$ gas. At this time, with the APC valve 243 of the exhaust pipe 231 open, the inside of the process chamber 201 is vacuum-exhausted by the vacuum pump 246, and the residual $TiCl_4$ gas and $SiH_4$ gas that are unreacted or have contributed to formation of the Ti-containing layer in the process chamber 201 are removed from the inside of the process chamber 201. At this time, with the valves 514, 524, 534, 544, and 554 open, supply of the $N_2$ gas into the process chamber 201 is maintained. The $N_2$ gas acts as a purge gas, and can enhance an effect of removing the residual $TiCl_4$ gas and $SiH_4$ gas that are unreacted or have contributed to formation of the Ti-containing layer in the process chamber 201 from the inside of the process chamber 201. Here, HCl which is a growth inhibition factor reacts with $SiH_4$, to generate silicon tetrachloride ($SiCl_4$) and $H_2$, which are discharged from the process chamber 201.

($NH_3$ Gas Supply, Third Step)

After the residual gas in the process chamber 201 is removed, an $NH_3$ gas is supplied into the process chamber 201 by a similar processing procedure to the third step in the film forming step of the above-described embodiment.

(Residual Gas Removal, Fourth Step)

After a lapse of a predetermined time from start of supply of the $NH_3$ gas, the valve 334 is closed to stop supply of the $NH_3$ gas. At this time, with the APC valve 243 of the exhaust pipe 231 open, the inside of the process chamber 201 is vacuum-exhausted by the vacuum pump 246, and the residual $NH_3$ gas that is unreacted or has contributed to formation of the TiN layer and a reaction by-product in the process chamber 201 are removed from the inside of the process chamber 201 by a similar processing procedure to the fourth step in the film forming step of the above-described embodiment.

(Predetermined Number of Times of Execution)

By performing the cycle of sequentially performing the first to fourth steps described above a predetermined number of times (n times), a TiN film having a predetermined thickness (for example, a film thickness thicker than 40 Å) and film continuity is formed on the wafer 200.

Also in the present Modification, by performing the slimming step in a similar manner to the above-described embodiment, similar effects to those of the film forming sequence illustrated in FIG. 4 can be obtained.

Modification 2

Figure 7:
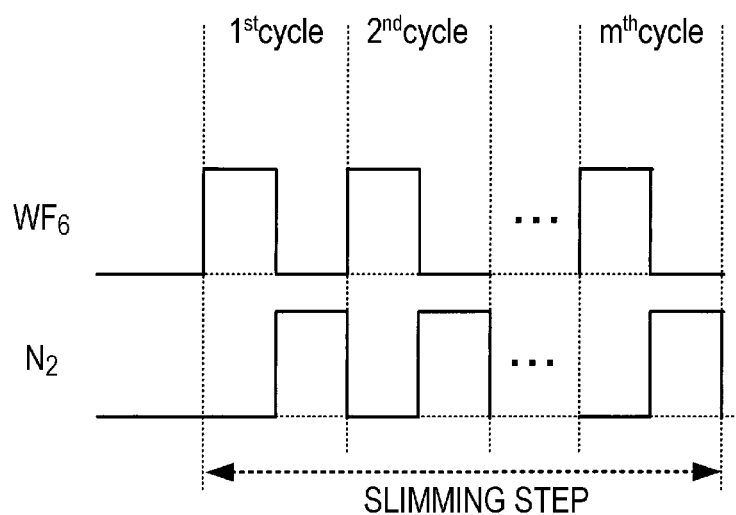
FIG. 7 is a diagram illustrating a modification of the slimming step in the film forming sequence according to the embodiment of the present disclosure.

Modification 2 is different from the above-described embodiment in the slimming step. Specifically, the $O_2$ gas supply in the fifth step and the residual gas removal in the sixth step in the slimming step of the above-described embodiment are not performed. FIG. 7 is a diagram illustrating a timing of gas supply in the slimming step of Modification 2 applied to the present embodiment.

($WF_6$ Gas Supply, Seventh Step)

After the residual gas in the process chamber 201 is removed, the valve 354 is opened to cause a $WF_6$ gas as a halogen-containing gas to flow into the gas supply pipe 350. The flow rate of the $WF_6$ gas is adjusted by the MFC 352, and the $WF_6$ gas is supplied from the gas supply holes 450a of the nozzle 450 into the process chamber 201, and is exhausted from the exhaust pipe 231. At this time, the $WF_6$ gas is supplied to the wafers 200. At this time, the valve 554 is simultaneously opened to cause an inert gas such as a $N_2$ gas to flow into the gas supply pipe 550. The flow rate of the $N_2$ gas flowing in the gas supply pipe 550 is adjusted by the MFC 552, and the $N_2$ gas that has flowed in the gas supply pipe 550 is supplied together with the $WF_6$ gas into the process chamber 201, and is exhausted from the exhaust pipe 231. At this time, the valves 514, 524, 534, and 544 are closed to stop supply of the $N_2$ gas from the nozzles 410, 420, 430, and 440.

At this time, the gas flowing in the process chamber 201 is the $WF_6$ gas. Supply of the $WF_6$ gas etches the TiN film formed on the wafer 200 in the film forming step.

(Residual Gas Removal, Eighth Step)

After a lapse of a predetermined time from start of supply of the $WF_6$ gas, the valve 354 is closed to stop supply of the $WF_6$ gas.

Then, the residual $WF_6$ gas that is unreacted or has contributed to formation of the TiN layer, TiWFx which is a reaction by-product, and the like in the process chamber 201 are discharged from the inside of the process chamber 201 by a similar processing procedure to the eighth step in the slimming step described above.

(Predetermined Number of Times of Execution)

By performing the cycle of sequentially performing the seventh and eighth steps described above one or more times (a predetermined number of times (m times)), the TiN layer on the wafer 200 is etched to form a TiN film having a predetermined thickness (for example, 5 to less than 40 Å). The above-described cycle is preferably repeated a plurality of times.

That is, by pulse-supplying the $WF_6$ gas, it is possible to improve removal efficiency of TiWFx which is a by-product obtained by a reaction between the $WF_6$ gas and the TiN layer. In addition, by pulse supply, a slimming amount (etching amount) can be controlled, and similar effects to those of the film forming sequence illustrated in FIG. 4 can be obtained.

Modification 3

Modification 3 is different from the above-described embodiment in the slimming step. Specifically, supply of the $O_2$ gas in the fifth step and supply of the $WF_6$ gas in the seventh step in the slimming step of the film forming sequence illustrated in FIG. 4 described above are performed so as to overlap each other.

Figure 8:
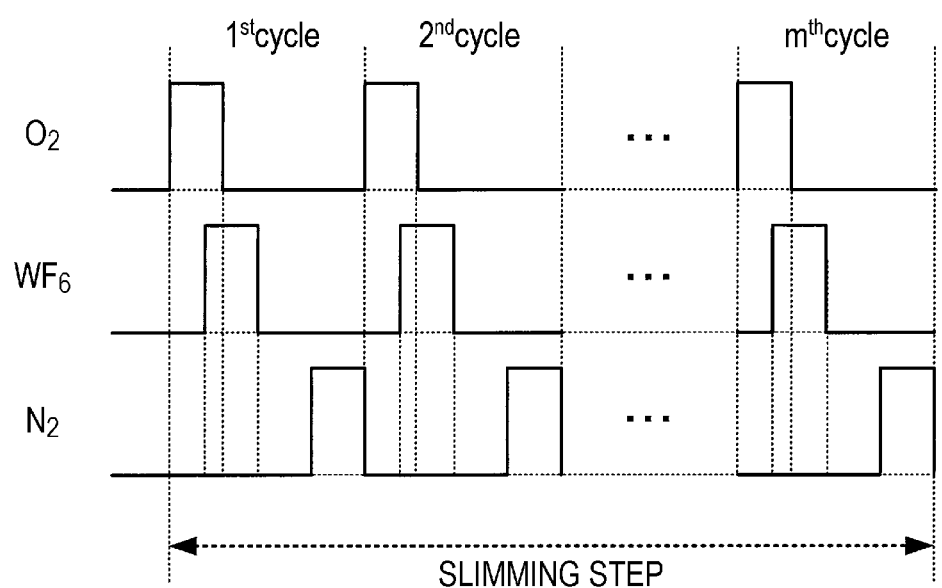
FIG. 8 is a diagram illustrating a modification of the slimming step in the film forming sequence according to the embodiment of the present disclosure.

FIG. 8 is a diagram illustrating a timing of gas supply in the slimming step of Modification 3 applied to the present embodiment.

That is, similar effects to those of the film forming sequence illustrated in FIG. 4 can be obtained also by the gas supply timing in the present Modification, and the TiNO layer on the wafer 200 is etched to form a TiN film having a predetermined thickness (for example, 5 to less than 40 Å). Note that supply of the $O_2$ gas and supply of the $WF_6$ gas may be performed simultaneously.

That is, by performing supply of the $O_2$ gas and supply of the $WF_6$ gas so as to overlap each other and pulse-supplying the $WF_6$ gas, it is possible to improve removal efficiency of TiWFxOy which is a by-product obtained by a reaction between the $WF_6$ gas and the TiN layer. In addition, by pulse supply, a slimming amount (etching amount) can be controlled.

Note that in the above embodiment, the case where the $WF_6$ gas is used as a gas containing a halogen element and a metal element as the halogen-containing gas used in the slimming step has been described, but the present disclosure is not limited thereto, and can also be applied to a case where a halogen-containing gas containing no metal element is used. Examples of the halogen-containing gas containing no metal element include a $NF_3$ gas, a $ClF_3$ gas, a $F_2$ gas, and a HF gas. Note that the halogen element is Cl, F, Br, or the like, and the metal element is W, Ti, Ta, Mo, Zr, Hf, Al, Si, Ge, Ga, or the like. The present disclosure can be applied to a gas containing these elements. Note that the halogen-containing gas may be a gas further containing an oxygen (O) element. Examples thereof include $MoO_2Cl_2$ and $MoOCl_4$.

In the above embodiment, the case where the $O_2$ gas is used as the oxygen-containing gas used in the slimming step has been described, but the present disclosure is not limited thereto, and can be applied to a case where an oxygen-containing gas such as an $O_3$ gas) or an $H_2O$ gas is used.

In the above embodiment, the step of slimming the TiN film has been exemplified, but the present disclosure can also be applied to a metal film other than the TiN film. Examples of the metal element include W, Ta, Mo, Zr, Hf, Al, Si, Ge, and Ga, elements belonging to the same group as these elements, and transition metals. The present disclosure can also be applied to a film formed of any one of these elements alone, a compound film (nitride film) made of any one of these metals and nitrogen, a compound film (oxide film) made of any one of these metals and oxygen, and the like. It is only required to perform the fifth and seventh steps of the above embodiment on these films. The gases supplied in the seventh and fifth steps are appropriately selected according to a target film.

In addition, in the above-described embodiment, an example has been described in which a film is formed using a substrate processing apparatus that is a batch type vertical apparatus that processes a plurality of substrates at a time, but the present disclosure is not limited thereto, and can be suitably applied to a case where a film is formed using a single wafer type substrate processing apparatus that processes one or several substrates at a time. In addition, in the above-described embodiment, an example has been described in which a thin film is formed using a substrate processing apparatus including a hot wall type process furnace, but the present disclosure is not limited thereto, and can also be suitably applied to a case where a thin film is formed using a substrate processing apparatus including a cold wall type process furnace. Also in these cases, a processing condition can be, for example, similar to that in the above-described embodiment.

Figure 9A:
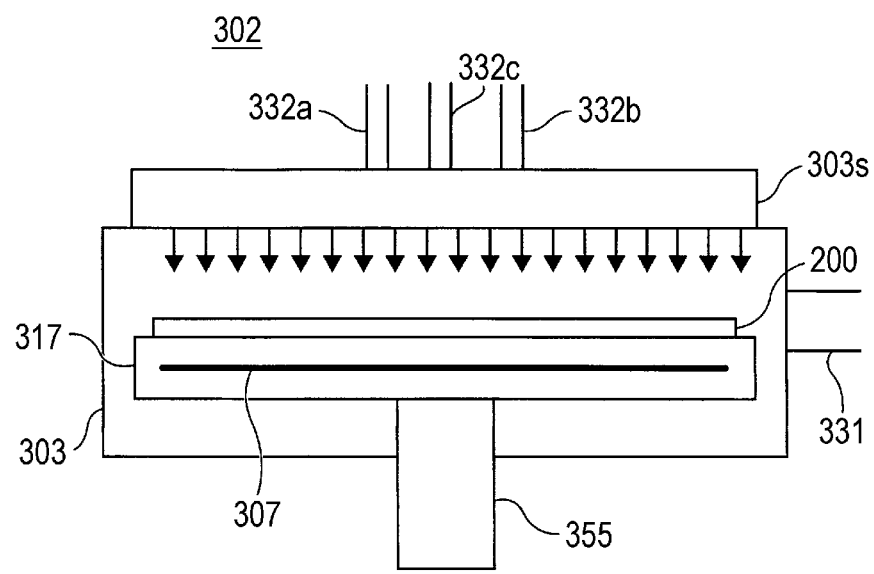
FIGS. 9A and 9B are vertical cross-sectional views schematically illustrating a process furnace of a substrate processing apparatus according to another embodiment of the present disclosure.

For example, the present disclosure can also be suitably applied to a case where a film is formed using a substrate processing apparatus including a process furnace 302 illustrated in FIG. 9A. The process furnace 302 includes a process vessel 303 that forms a process chamber 301, a shower head 303s that supplies gas into the process chamber 301 in a shower shape, a support table 317 that supports one or several wafers 200 in a horizontal posture, a rotation shaft 355 that supports the support table 317 from below, and a heater 307 disposed in the support table 317. To an inlet (gas introduction port) of the shower head 303s, a gas supply port 332a that supplies the above-described raw material gas, a gas supply port 332b that supplies the above-described reactant gas, and a gas supply port 332c that supplies the above-described halogen-containing gas are connected. To the gas supply port 332a, a raw material gas supply system similar to the raw material gas supply system of the above-described embodiment is connected. To the gas supply port 332b, a reactant gas supply system similar to the reactant gas supply system of the above-described embodiment is connected. To the gas supply port 332c, a gas supply system similar to the above-described halogen-containing gas supply system is connected. In an outlet (gas discharge port) of the shower head 303s, a gas dispersion plate that supplies gas into the process chamber 301 in a shower shape is disposed. In the process vessel 303, an exhaust port 331 that exhausts the inside of the process chamber 301 is disposed. To the exhaust port 331, an exhaust system similar to the exhaust system of the above-described embodiment is connected.

Figure 9B:
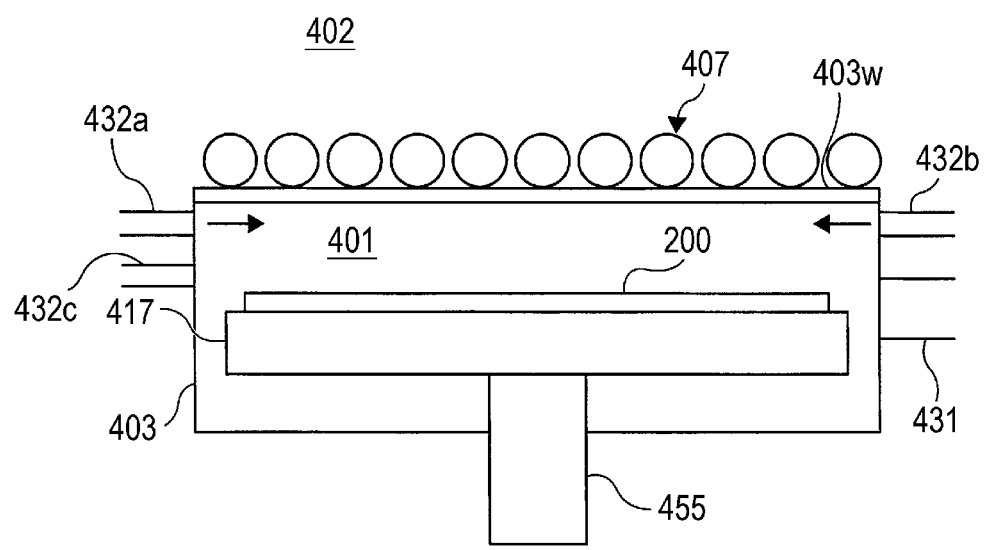

For example, the present disclosure can also be suitably applied to a case where a film is formed using a substrate processing apparatus including a process furnace 402 illustrated in FIG. 9B. The process furnace 402 includes a process vessel 403 that forms a process chamber 401, a support table 417 that supports one or several wafers 200 in a horizontal posture, a rotation shaft 455 that supports the support table 417 from below, a lamp heater 407 that irradiates the wafers 200 in the process vessel 403 with light, and a quartz window 403w that transmits light of the lamp heater 407. To the process vessel 403, a gas supply port 432a that supplies the above-described raw material gas, a gas supply port 432b that supplies the above-described reactant gas, and a gas supply port 432c that supplies the above-described halogen-containing gas are connected. To the gas supply port 432a, a raw material gas supply system similar to the raw material gas supply system of the above-described embodiment is connected. To the gas supply port 432b, a reactant gas supply system similar to the reactant gas supply system of the above-described embodiment is connected. To the gas supply port 432c, a gas supply system similar to the halogen-containing gas supply system of the above-described embodiment is connected. In the process vessel 403, an exhaust port 431 that exhausts the inside of the process chamber 401 is disposed. To the exhaust port 431, an exhaust system similar to the exhaust system of the above-described embodiment is connected.

In addition, the TiN film may be formed using a chemical vapor deposition (CVD) apparatus which is an example of a substrate processing apparatus.

Even in a case of using this substrate processing apparatus, a film can be formed with a sequence and a processing condition similar to those in the above-described embodiment.

It is preferable to individually prepare (prepare a plurality of) process recipes (programs in which a processing procedure, a processing condition, and the like are described) used for forming various thin films according to the contents of substrate processing (film type, composition ratio, film quality, film thickness, processing procedure, processing condition, and the like of a thin film to be formed). Then, when substrate processing is started, it is preferable to appropriately select an appropriate process recipe from among a plurality of process recipes according to the contents of the substrate processing. Specifically, it is preferable to store (install) a plurality of process recipes individually prepared according to the contents of the substrate processing in advance in the memory 121c included in the substrate processing apparatus via a telecommunication line or a recording medium (external memory 123) in which the process recipes are recorded. Then, when the substrate processing is started, the CPU 121a included in the substrate processing apparatus preferably appropriately selects an appropriate process recipe from among the plurality of process recipes stored in the memory 121c according to the contents of the substrate processing. With such a configuration, one substrate processing apparatus can generally form thin films of various film types, composition ratios, film qualities, and film thicknesses with good reproducibility. In addition, it is possible to reduce an operation load (for example, an input load of a processing procedure, a processing condition, and the like) of an operator, and it is possible to quickly start the substrate processing while avoiding an operation error.

In addition, the present disclosure can also be achieved, for example, by changing a process recipe of an existing substrate processing apparatus. When a process recipe is changed, the process recipe according to the present disclosure can be installed in an existing substrate processing apparatus via a telecommunication line or a recording medium in which the process recipe according to the present disclosure is recorded, or a process recipe itself of an existing substrate processing apparatus can be changed to the process recipe according to the present disclosure by operating an input/output device of the existing substrate processing apparatus.

Although various typical embodiments of the present disclosure have been described above, the present disclosure is not limited to these embodiments, and these embodiments can be appropriately combined to be used.

The present disclosure can form a film having film continuity.

What is claimed is:
1. A method of processing a substrate, comprising:
preparing the substrate having a metal nitride film formed on a surface thereof; and
slimming the metal nitride film by pulse-supplying a metal and halogen-containing gas to the metal nitride film without supplying oxygen-containing gas to the metal nitride film,
wherein the metal and the halogen-containing gas contain tungsten hexafluoride.
2. The method of claim 1, further comprising, before slimming the metal nitride film, forming the metal nitride film on the substrate by performing supply of a gas containing a metal and a halogen and supply of a nitrogen-containing gas a predetermined number of times, or performing supply of a gas containing the metal and the halogen, supply of a silane-based gas, and supply of the nitrogen-containing gas a predetermined number of times.
3. A method of manufacturing a semiconductor device, comprising the method of claim 1.
4. The method of claim 1, further comprising:
forming the metal nitride film on the substrate on which an insulating film is formed.
5. The method of claim 4, wherein the metal-nitride film forms in an island shape when the metal nitride film is formed on the insulating film in a thickness of 30 Å or less.

6. The method of claim 4, wherein in forming the metal nitride film on the substrate on which the insulating film is formed, the metal nitride film is formed to a thickness that provides film continuity.

7. The method of claim 6, wherein in slimming the metal nitride film, the metal nitride film is made into a thickness of 30 Å or less.

8. The method of claim 5, wherein in forming the metal nitride film on the substrate on which the insulating film is formed, the metal nitride film is formed to a thickness that provides film continuity.

9. The method of claim 8, wherein in slimming the metal nitride film, the metal nitride film is made into a thickness of 30 Å or less.

* * * * *